(12) United States Patent
Kuhls et al.

(10) Patent No.: US 12,370,665 B2
(45) Date of Patent: Jul. 29, 2025

(54) POWER TOOL MOTOR CONTROL SYSTEM AND METHOD

(71) Applicant: Milwaukee Electric Tool Corporation, Brookfield, WI (US)

(72) Inventors: Alex R. Kuhls, Brookfield, WI (US); Daniel W. Ruppert, Brookfield, WI (US)

(73) Assignee: Milwaukee Electric Tool Corporation, Brookfield, WI (US)

( * ) Notice: Subject to any disclaimer, the term of this patent is extended or adjusted under 35 U.S.C. 154(b) by 0 days.

(21) Appl. No.: 18/582,370

(22) Filed: Feb. 20, 2024

(65) Prior Publication Data

US 2024/0278410 A1 Aug. 22, 2024

Related U.S. Application Data

(60) Provisional application No. 63/486,155, filed on Feb. 21, 2023.

(51) Int. Cl.
*B25F 5/00* (2006.01)
*G01R 19/165* (2006.01)
*H02J 7/00* (2006.01)

(52) U.S. Cl.
CPC ........ *B25F 5/005* (2013.01); *G01R 19/16542* (2013.01); *H02J 7/0047* (2013.01)

(58) Field of Classification Search
CPC .... B25F 5/005; G01R 19/16542; B25B 27/02
See application file for complete search history.

(56) References Cited

U.S. PATENT DOCUMENTS

| | | | |
|---|---|---|---|
| 5,727,417 A | 3/1998 | Moffatt et al. | |
| 6,035,775 A | 3/2000 | Nghiem | |
| 2014/0367134 A1 | 12/2014 | Phillips et al. | |
| 2016/0363510 A1* | 12/2016 | Kanack | B25B 27/10 |
| 2018/0021840 A1* | 1/2018 | Thorson | B21D 39/04 |
| | | | 72/416 |
| 2019/0030698 A1* | 1/2019 | Frenken | B25F 5/005 |
| 2019/0232481 A1* | 8/2019 | Skinner | B25B 27/10 |
| 2020/0238487 A1 | 7/2020 | Kanack et al. | |
| 2023/0015954 A1 | 1/2023 | Schneider et al. | |
| 2024/0001520 A1 | 1/2024 | Kanack et al. | |

* cited by examiner

*Primary Examiner* — Nathaniel C Chukwurah
(74) *Attorney, Agent, or Firm* — Quarles & Brady LLP

(57) ABSTRACT

Embodiments of the disclosure provide a system and method of operating a power tool. The method includes measuring a battery current draw, sampling the battery current draw to generate a plurality of battery current samples, calculating an averaged current value by averaging the plurality of battery current samples, and comparing the averaged current value with a predetermined current value. The method also includes determining a number of motor revolutions, comparing the number of motor revolutions to a startup threshold, and determining a cycle is complete and stopping the motor when the number of motor revolutions exceeds the startup threshold and the averaged current value is greater than the predetermined current value.

20 Claims, 4 Drawing Sheets

POWER TOOL MOTOR CONTROL SYSTEM AND METHOD

BACKGROUND

Battery powered hydraulic crimping and cutting tools use high amounts of force to complete a wide variety of applications. This high amount of force is generated using a hydraulic pump, which compresses oil leading to a high pressure. Typically, the hydraulic cycles are controlled using feedback from a pressure sensor connected to the main hydraulic cylinder. This pressure sensor takes up space, is complicated, and is expensive so the ability to remove it would be beneficial to overall tool design.

SUMMARY

Embodiments of the disclosure provide a method of operating and controlling a power tool, such as a hydraulic power tool, without using a pressure sensor. The method includes measuring a battery current draw, sampling the battery current draw to generate a plurality of battery current samples, calculating an averaged current value by averaging the plurality of battery current samples, and comparing the averaged current value with a predetermined current value. The method also includes determining a number of motor revolutions, comparing the number of motor revolutions to a startup threshold, and determining a cycle is complete and stopping the motor when the number of motor revolutions exceeds the startup threshold and the averaged current value is greater than the predetermined current value.

Embodiments of the disclosure provide a power tool including a hydraulic pump, a motor to drive the hydraulic pump, a battery to power the motor, a current sense resistor in series with the motor and the battery, and a controller that measures current drawn from the battery using the current sense resistor to determine a plurality of battery current samples. The controller calculates an averaged current value by averaging the plurality of battery current samples and compares the averaged current value to a predetermined current value. The controller also determines a number of motor revolutions, compares the number of motor revolutions to a startup threshold, and determines a cycle is complete and stopping the motor when the number of motor revolutions exceeds the startup threshold and the averaged current value is greater than the predetermined current value.

DETAILED DESCRIPTION

The following detailed description describes various features and functions of the disclosed method with reference to the accompanying figures. The illustrative methods and systems described herein are not meant to be limiting. It may be readily understood that the aspects of the disclosed method and system can be arranged and combined in a wide variety of different configurations, all of which are contemplated herein.

Some battery powered hydraulic work tools use high amounts of force generated by using a hydraulic pump 104 to complete work applications such as crimping and cutting. The hydraulic pump 104 compresses oil, leading to a high pressure. The hydraulic cycles are often controlled using feedback from a pressure sensor connected to the main hydraulic cylinder. The output of the pressure sensor is received by a motor control unit, and the firmware inside the motor control unit determines when the hydraulic cycle is complete and actuates the tool accordingly. However, this pressure sensor takes up space, is complicated, and is expensive.

The disclosure relates generally to controlling hydraulic pressure without the use of a pressure sensor. More particularly, the disclosure relates to a hydraulic tool having a firmware algorithm that uses battery current as feedback to determine when the hydraulic cycle is complete. For example, one implementation of the disclosure provides a firmware algorithm that uses battery current, measured by the motor control unit, as feedback to determine when the hydraulic cycle is complete. The firmware algorithm can be implemented in different tools. For example, the tool can be a cutting tool, a punching tool, a crimping tool, a screwdriver, a rivet tool, a ratchet, a press tool, an expander tool, etc., with each tool having an actuator with a moveable component that is configured to implement at least one functionality on a work piece that the tool contacts.

Figure 1A:
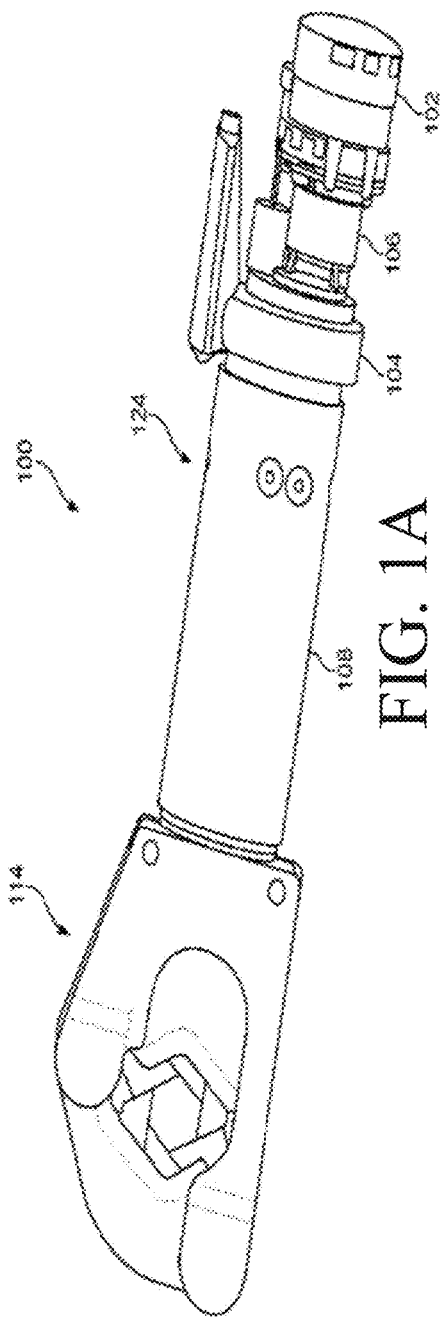
FIG. 1A is an isometric view of a hydraulic power tool, according to an example embodiment.

FIG. 1A illustrates components of a hydraulic power tool, according to an example implementation. Although the example implementation described herein references an example crimping tool, it can be understood that the features of this disclosure can be implemented in other similar hydraulic power tools, such as cutting tools. As one example, the illustrated hydraulic tool 100 includes a working head that utilizes a hex or six-sided crimping head 114. The hydraulic crimping tool 100 includes an electric motor 102 configured to drive a pump 104 through a gear reducer 106. The pump 104 provides pressurized hydraulic fluid to a hydraulic circuit 124 including a hydraulic actuator cylinder 108, which includes a piston or ram.

Figure 1B:
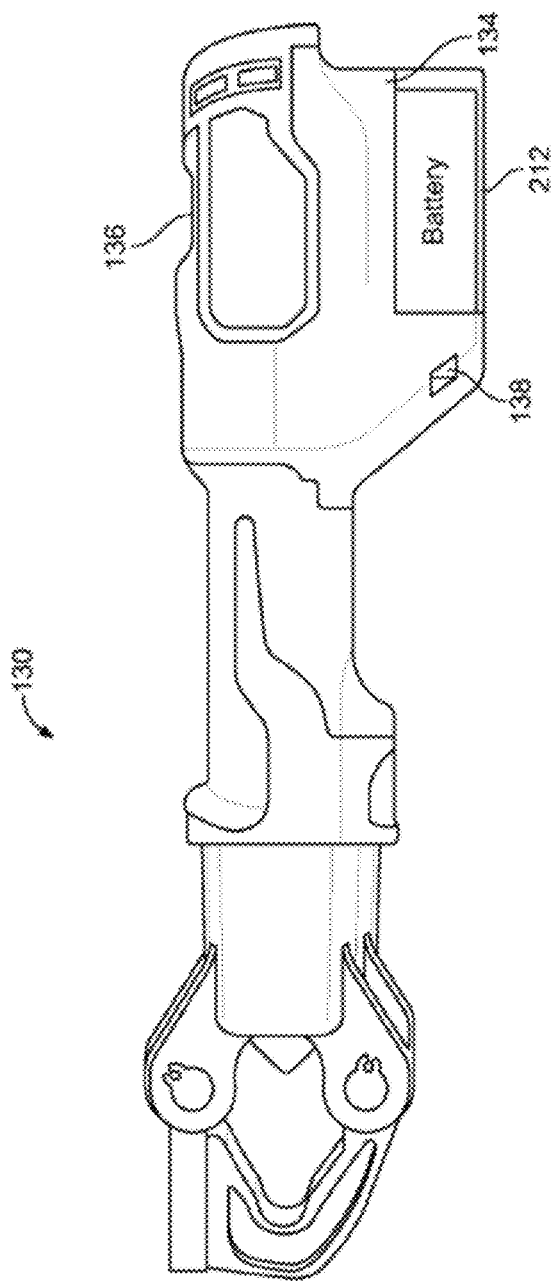
FIG. 1B is an isometric view of an alternative hydraulic power tool including a punch-style crimping head, according to an example embodiment.

FIG. 1B illustrates an alternative hydraulic power tool 130, including a punch-style crimping head, according to an example implementation. In one example and as shown in FIG. 1B, a user interface 136 can be positioned along a top surface of the hydraulic tool 130. The hydraulic tool 130 may also include a trigger switch 138 mounted along the bottom portion of the hydraulic tool near a battery 212. In some embodiments, the user interface can also be placed along a different surface of the hydraulic tool 130 including along the side or bottom of the hydraulic tool 130.

Figure 2:
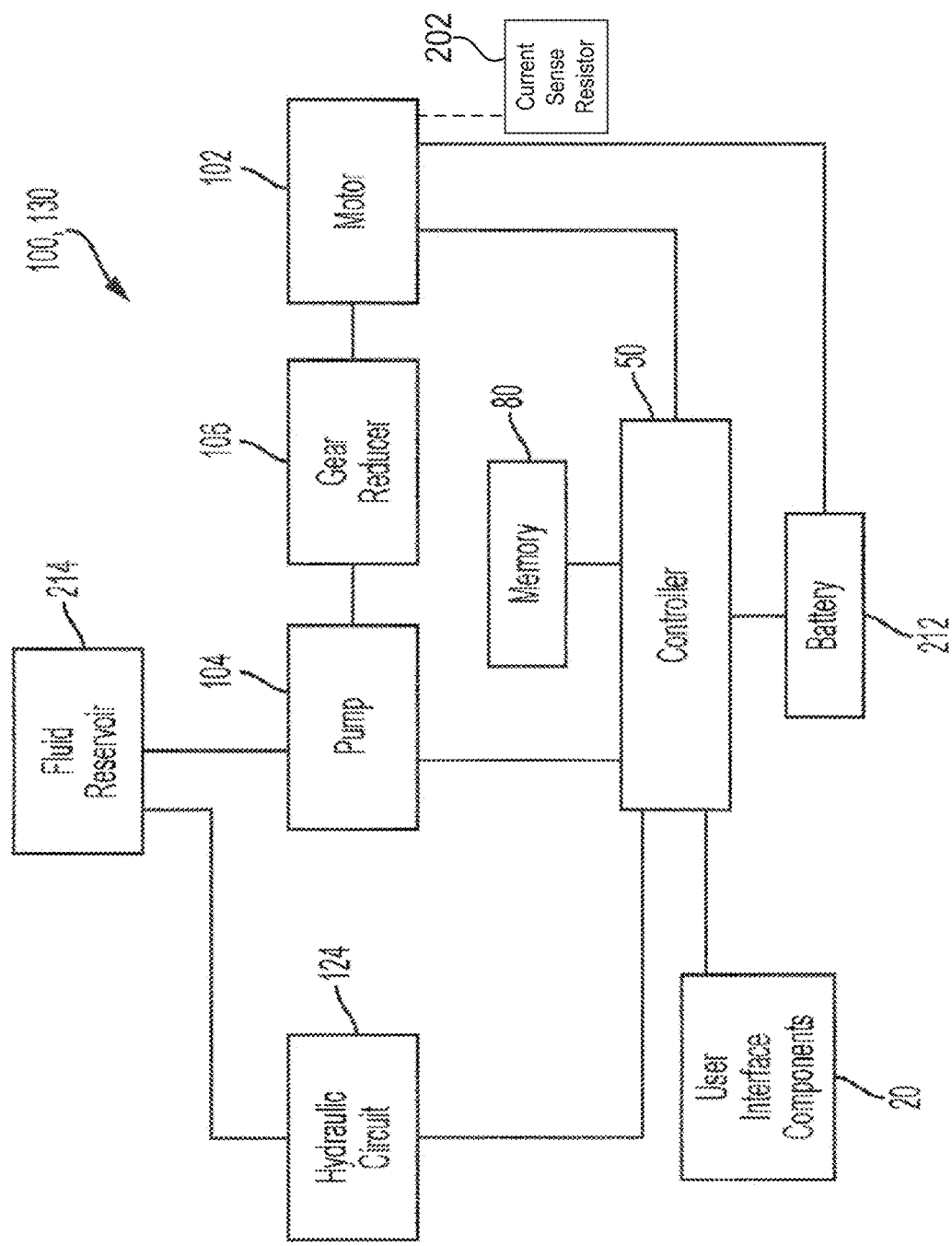
FIG. 2 is a block diagram of certain components of the hydraulic power tool illustrated in FIG. 1.

FIG. 2 illustrates a block diagram of a hydraulic and electronic control system for the hydraulic tools 100 and 130 of FIGS. 1A and 1B. The hydraulic tool 100, 130 can include user interface components 20 that provide input to the power tool, such as a controller 50 (also referred to as a motor control unit or a motor inverter) of the power tool 100. For example, such user interface components 20 can include an operator panel, one or more switches, one or more push buttons, one or more interactive indicating lights, soft touch screens or panels, and other types of similar switches such as a trigger switch, and any combination of the aforementioned. The controller 50 includes a processor connected to memory 80 and the user interface components 20. The memory 80 can include instructions that, when executed by the processor, cause the controller 50 to operate the tool 100, 130.

As also shown in FIG. 2, the tool 100, 130 includes a fluid reservoir 214 that is in fluid communication with the hydraulic circuit 124 and the pump 104. The battery 212 can be removably connected to a portion of the hydraulic tool. As shown in FIG. 1A, the battery 212 can be removably connected to the bottom portion 134 of the hydraulic tool 130 away from the crimping head.

The battery 212 provides electrical energy that is converted into mechanical energy by the hydraulic pump 104 and the motor 102. The hydraulic pump 104, as part of the hydraulic operation front end 102, is responsible for generating a high amount of force used by the hydraulic tool 100, 130. The pump 104 compresses oil, leading to a high pressure that is used to actuate the tool 100, 130. The hydraulic pump 104 is housed within the reduction gearbox 106 and is connected to the hydraulic system circuitry 124.

FIG. 2 illustrates a current sense resistor 202 positioned in series with the motor 102 and the battery 212. The current sense resistor 202 measures the current drawn from the battery 212. The current sense resistor 202 provides a voltage drop proportional to the current flowing through it. This voltage drop is then used by the controller 50 to measure the current drawn from the battery 212. The controller 50 is programmed to measure the current from the battery 212 using the current sense resistor 202 and to determine the completion of a hydraulic cycle based on the measured current. In some embodiments, the controller 50 samples the current measurement every millisecond while the motor 102 is running. The controller 50 then averages each sample with the previous current samples. Once the averaged current value exceeds a predetermined value, the controller 50 determines that the hydraulic cycle is complete and shuts down the motor 102. The controller 50 also monitors the number of motor revolutions since the beginning of the cycle to avoid false positive crimp events during motor startup. More specifically, if a high current event occurs before the tool is able to output high force, the controller 50 ignores the current.

In some embodiments, the system temperature may be measured using a thermistor, a type of temperature-sensitive resistor. The resistance of the thermistor changes with temperature, providing a means to measure the system's temperature. The thermistor may be integrated into the hydraulic power tool assembly, for example, within the hydraulic system circuitry 124 shown in FIG. 2.

The measured temperature may be used to refine the estimated hydraulic pressure. The hydraulic pressure is initially estimated based on the battery current, as described above. In some embodiments, the hydraulic pressure can be influenced by the system temperature. For example, an increase in temperature can cause the hydraulic fluid to expand, potentially increasing the hydraulic pressure. Therefore, the system temperature is an additional factor that can be used to refine the estimation of the hydraulic pressure.

The controller 50 receives the temperature measurement from the thermistor and uses this information to adjust the estimated hydraulic pressure. This adjustment can be performed using a variety of methods, such as applying a correction factor that is based on the measured temperature. By measuring the system temperature and adjusting the estimated hydraulic pressure accordingly, the hydraulic power tool assembly can provide more accurate control over the hydraulic cycle. More accurate control over the hydraulic cycle can lead to improved performance of the tool, such as more precise control over the force applied by the tool. More accurate control over the hydraulic cycle may also help to prevent potential performance issues, such as overheating of the system.

Figure 3:
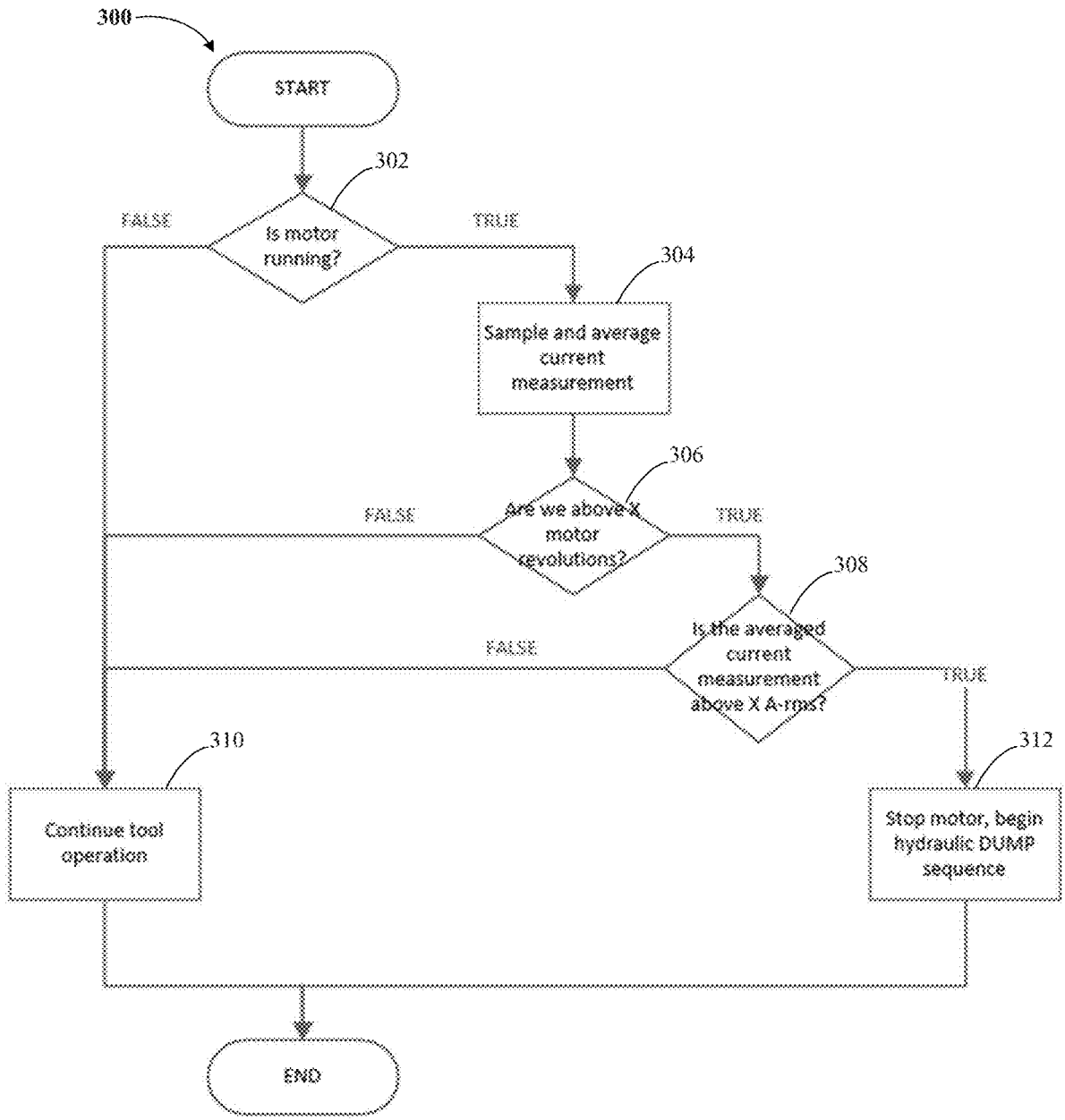
FIG. 3 is a flowchart of an example firmware algorithm method utilizing a hydraulic power tool illustrated in FIG. 1.

FIG. 3 is a flowchart of a firmware algorithm process 300 that uses battery current as feedback for determining when the hydraulic cycle is complete, according to one implementation of a method of the disclosure. The controller 50 determines (at 302) whether the motor 102 is running. In some implementations, this determination can be based on the controller 50 measuring battery current draw using the current sense resistor 202 in series with the motor 102. The current sense resistor 202 can be a two-terminal current sense resistor or a four-terminal current sense resistor that provides two terminals for the current path. In still further implementations, the controller 50 can use other methods to detect the battery current draw, including current sensing amplifiers, coulomb counting, a separate battery monitoring circuit, tracking an offset voltage, or another suitable method of detecting battery current draw. Some implementations can include additional firmware elements to measure the battery current draw. If the motor is not running, the controller 50 can wait (at 310) for the user to continue operation of the tool.

If the motor is running, the controller 50 samples (at 304) the battery current draw to generate battery current samples. For example, in some implementations, the controller 50 can sample (at 304) the battery current draw at least once per millisecond. The controller 50 calculates (at 304) an averaged current value using, for example, at least 15 battery current samples. The controller 50 uses the averaged current value as cycle feedback for the firmware algorithm process 300.

The controller 50 determines (at 306) the number of motor revolutions since tool startup and whether the number of motor revolutions exceeds a predetermined threshold. In some implementations, the controller 50 may use a tachometer to determine the number of motor revolutions since tool startup. In some implementations, the tachometer can be an electronic tachometer. In other implementations, the tachometer may be a basic mechanical tachometer, a resonance tachometer, a contact tachometer, a non-contact tachometer, a laser tachometer or an optical tachometer. In further implementations, the controller 50 can use a stroboscope, an optical instrument, a digital encoder, a potentiometer, or other suitable counting methods to track motor revolutions. Counting methods can include magnetic counting, optical counting, accelerometer counting, audio counting, or other suitable methods of counting. In some implementations, additional software elements can be added to the controller to count the number of motor revolutions.

There are high current events during motor startup that can lead to false positive crimp events. If these high current events occur before the tool 100, 130 is able to output high force, the controller 50 determines that the tool 100, 130 is in a startup scenario and the current draw measurements are ignored. More specifically, if the controller 50 determines (at 306) that the number of motor revolutions does not exceed a predetermined threshold, the process 300 can wait (at 310) for the user to continue operation of the tool 100, 130. This method is used to avoid a false positive crimp event.

FIG. 3 illustrates one implementation of an algorithm with a linear sequence of events. The algorithm restarts after completion. However, in other implementations, this algorithm can be modified to include a while loop, for loop, or other firmware element, where the loops would allow the process to continue running until all conditions to stop are met. Additionally, in this implementation, different relevant measurements are taken in series. However, in further implementations, measurements can be taken at the same time or in a different order.

If the number of motor revolutions exceeds the predetermined threshold, the controller 50 compares (at 308) the averaged current value with a predetermined current value. If the averaged current value exceeds the predetermined current value, the cycle completion module (at 312) uses the controller 50 to determine that the hydraulic cycle is complete, stops the motor 102, and generates a command to begin a hydraulic dump sequence. If, however, the controller 50 determines (at 308) that the number of motor revolutions does not exceed a predetermined threshold, the process 300 can proceed to block 310 to wait for the user to continue operation of the tool 100, 130.

In this implementation, a low-level firmware algorithm is used. However, in additional implementations, a high-level firmware algorithm can be used. The high-level firmware algorithm can be deployed within a flash memory chip and allow for updates to be made. In still further implementations, the algorithm can be implemented within subsystems. These subsystems can be semi-independent devices that are part of a more extensive system. The firmware can be embedded within a central processing unit, a flash chip, a liquid crystal display unit, or another suitable type of controller. The firmware can be a basic input/output system (BIOS), an extensible firmware interface (EFI), or another suitable type of firmware.

Thus, in some implementations of the disclosure, the process 300 can be used to determine that a hydraulic cycle is complete, without using a pressure sensor, and stop the motor 102 when two conditions occur, namely the number of motor revolutions exceeds a startup threshold and an averaged current value is greater than a pre-determined current value (e.g., 25 A-rms).

Alternatively, in other implementations, the impedance of the battery 212, together with the battery voltage can be used in addition to the averaged current value to determine that a hydraulic cycle is complete.

Figure 4:
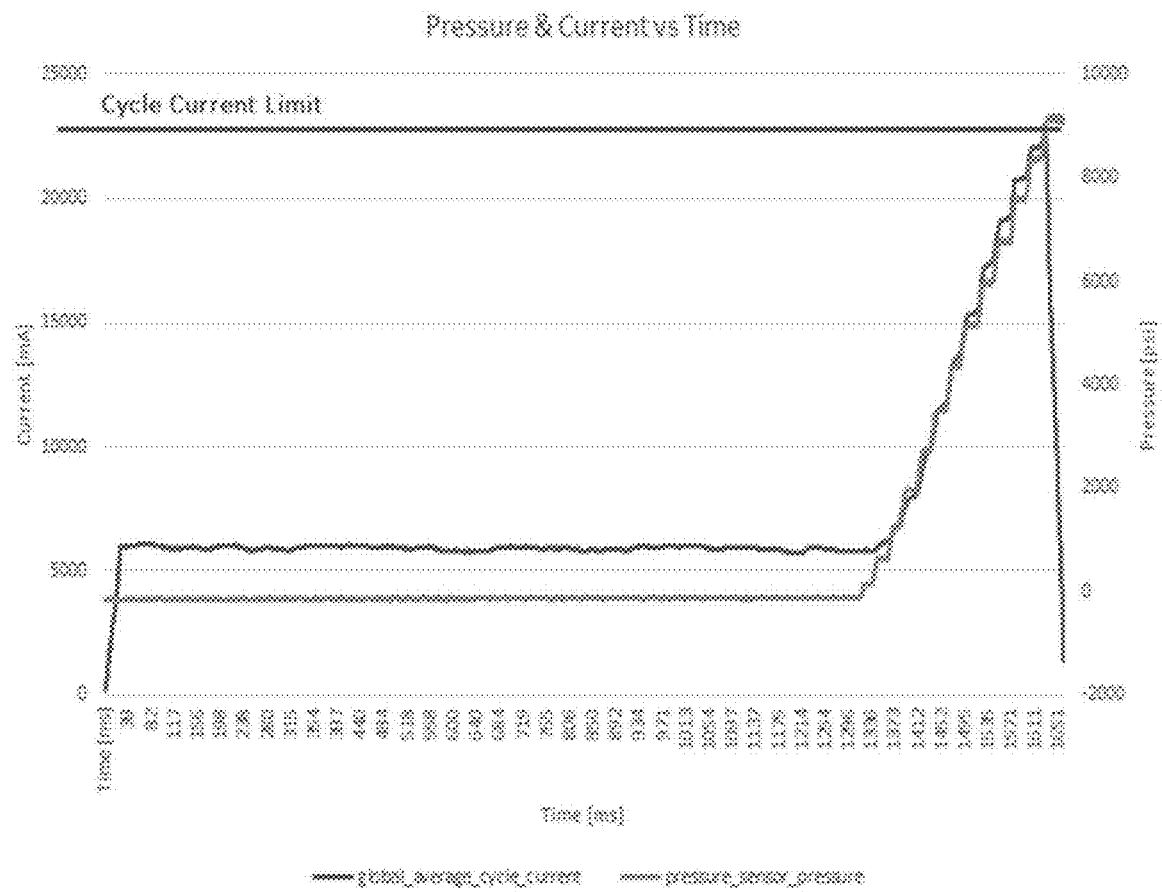
FIG. 4 is a plot diagram of averaged current versus pressure.

FIG. 4 illustrates a plot overlaying a conventional pressure sensor pressure reading and an averaged current reading, according to implementations of the disclosure. Battery current is related to the work conducted by the hydraulic system, and thus, system pressure is approximated based on battery current.

It is to be understood that the disclosure is not limited in its application to the details of construction and the arrangement of components set forth in the description or illustrated in the drawings. The disclosure is capable of other implementations and of being practiced or of being carried out in various ways. Also, it is to be understood that the phraseology and terminology used herein is for the purpose of description and not of limitation. The use of "including," "comprising," or "having" and variations thereof herein is meant to encompass the items listed thereafter and equivalents thereof as well as additional items.

In some embodiments, aspects of the disclosure, including computerized implementations of methods according to the disclosure, can be implemented as a system, method, apparatus, or article of manufacture using standard programming or engineering techniques to produce software, firmware, hardware, or any combination thereof to control a processor device (e.g., a serial or parallel general purpose or specialized processor chip, a single- or multi-core chip, a microprocessor, a field programmable gate array, any variety of combinations of a control unit, arithmetic logic unit, and processor register, and so on), a computer (e.g., a processor device operatively coupled to a memory), or another electronically operated controller to implement aspects detailed herein. Accordingly, for example, embodiments of the disclosure can be implemented as a set of instructions, tangibly embodied on a non-transitory computer-readable media, such that a processor device can implement the instructions based upon reading the instructions from the computer-readable media. Some embodiments of the disclosure can include (or utilize) a control device such as an automation device, a special purpose or general purpose computer including various computer hardware, software, firmware, and so on, consistent with the discussion below. As specific examples, a control device can include a processor, a microcontroller, a field-programmable gate array, a programmable logic controller, logic gates etc., and other typical components that are known in the art for implementation of appropriate functionality (e.g., memory, communication systems, power sources, user interfaces and other inputs, etc.).

Certain operations of methods according to the disclosure, or of systems executing those methods, may be represented schematically in the figures or otherwise discussed herein. Unless otherwise specified or limited, representation in the figures of particular operations in particular spatial order may not necessarily require those operations to be executed in a particular sequence corresponding to the particular spatial order. Correspondingly, certain operations represented in the figures, or otherwise disclosed herein, can be executed in different orders than are expressly illustrated or described, as appropriate for particular embodiments of the disclosure. Further, in some embodiments, certain operations can be executed in parallel, including by dedicated parallel processing devices, or separate computing devices configured to interoperate as part of a large system.

As used herein in the context of computer implementation, unless otherwise specified or limited, the terms "component," "system," "module," etc. are intended to encompass part or all of computer-related systems that include hardware, software, a combination of hardware and software, or software in execution.

Various features and advantages of the disclosure are set forth in the following claims.

The invention claimed is:

1. A method of operating a power tool, the power tool including a motor and a battery, the method comprising:
measuring battery current draw;
sampling the battery current draw while the motor is running to generate a plurality of battery current samples;
calculating an averaged current value by averaging the plurality of battery current samples;
comparing the averaged current value with a predetermined current value;
determining a number of motor revolutions;
comparing the number of motor revolutions to a startup threshold; and
determining a cycle is complete and stopping the motor when the number of motor revolutions exceeds the startup threshold and the averaged current value is greater than the predetermined current value.

2. The method of claim 1 and further comprising measuring the battery current draw with a current sense resistor in series with the motor and the battery.

3. The method of claim 1 and further comprising sampling the battery current draw at least once per millisecond while the motor is running.

4. The method of claim 1 and further comprising calculating the averaged current value using at least 15 battery current samples.

5. The method of claim 1 and further comprising using the averaged current value to estimate pressure without the use of a pressure sensor.

6. The method of claim 1 and further comprising measuring a battery voltage and a battery impedance to estimate hydraulic pressure.

7. The method of claim 1 wherein the power tool is a hydraulic power tool.

8. The method of claim 7 and further comprising determining that a hydraulic cycle for at least one of a crimp operation and a cutting operation is complete based on the averaged current value.

9. The method of claim 7 and further comprising determining that a hydraulic cycle for at least one of a crimp operation and a cutting operation is complete based on the averaged current value, battery voltage, and battery impedance.

10. The method of claim 1 and further comprising measuring system temperature using a thermistor to adjust estimated pressure.

11. A power tool comprising:
a hydraulic pump;
a motor to drive the hydraulic pump;
a battery to power the motor;
a current sense resistor in series with the motor and the battery; and
a controller that measures current drawn from the battery using the current sense resistor to determine a plurality of battery current samples, the controller
calculating an averaged current value by averaging the plurality of battery current samples,
comparing the averaged current value to a predetermined current value,
determining a number of motor revolutions,
comparing the number of motor revolutions to a startup threshold, and
determining a cycle is complete and stopping the motor when the number of motor revolutions exceeds the startup threshold and the averaged current value is greater than the predetermined current value.

12. The power tool of claim 11, wherein the controller samples the battery current draw at least once per millisecond while the motor is running.

13. The power tool of claim 11, wherein the controller calculates the averaged current value using at least 15 battery current samples.

14. The power tool of claim 11, wherein the controller uses the averaged current value to estimate pressure.

15. The power tool of claim 11, wherein the controller measures a battery voltage and a battery impedance to estimate hydraulic pressure.

16. The power tool of claim 11, wherein the power tool is a hydraulic power tool.

17. The power tool of claim 16, wherein the controller determines that a hydraulic cycle for at least one of a crimp operation and a cutting operation is complete based on the averaged current value.

18. The power tool of claim 16, wherein the controller determines that a hydraulic cycle for at least one of a crimp operation and a cutting operation is complete based on the averaged current value and battery voltage.

19. The power tool of claim 16, wherein the controller determines that a hydraulic cycle for at least one of a crimp operation and a cutting operation is complete based on the averaged current value and battery impedance.

20. The power tool of claim 11, and further comprising a thermistor to measure system temperature and to adjust estimated pressure.

* * * * *